United States Patent
You

(10) Patent No.: US 7,384,476 B2
(45) Date of Patent: *Jun. 10, 2008

(54) METHOD FOR CRYSTALLIZING SILICON

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 350 days.

This patent is subject to a terminal disclaimer.

(21) Appl. No.: 10/851,180

(22) Filed: May 24, 2004

(65) Prior Publication Data

US 2004/0253819 A1 Dec. 16, 2004

(30) Foreign Application Priority Data

Jun. 12, 2003 (KR) .................. 10-2003-0037740

(51) Int. Cl.
C30B 3/00 (2006.01)
H01L 21/20 (2006.01)
H01L 29/12 (2006.01)

(52) U.S. Cl. .............................. 117/8; 117/43; 117/44; 117/45; 117/46; 117/73; 117/74; 117/904; 438/482; 438/486; 438/155; 438/166; 257/71; 257/72

(58) Field of Classification Search ............ 117/43–46, 117/73–74, 37, 54, 56, 904, 923; 438/482, 438/486–487, 155, 166, 795, 662; 257/71–72, 257/797, E21.413
See application file for complete search history.

(56) References Cited

U.S. PATENT DOCUMENTS

| | | | | |
|---|---|---|---|---|
| 6,322,625 B2 * | 11/2001 | Im | ........................ | 117/43 |
| 6,800,540 B1 * | 10/2004 | You | ........................ | 438/486 |
| 6,908,835 B2 * | 6/2005 | Sposili et al. | ........................ | 438/487 |
| 2002/0179001 A1 * | 12/2002 | Jung | ........................ | 117/4 |
| 2002/0179004 A1 * | 12/2002 | Jung | ........................ | 117/43 |
| 2002/0197759 A1 * | 12/2002 | Yang | ........................ | 438/48 |
| 2003/0088848 A1 * | 5/2003 | Crowder | ........................ | 716/19 |
| 2004/0053450 A1 * | 3/2004 | Sposili et al. | ........................ | 438/151 |
| 2005/0040148 A1 * | 2/2005 | Jung | ........................ | 219/121.65 |
| 2005/0056623 A1 * | 3/2005 | Jung | ........................ | 219/121.65 |
| 2005/0202654 A1 * | 9/2005 | Im | ........................ | 438/487 |
| 2005/0271952 A1 * | 12/2005 | Jung | ........................ | 430/5 |
| 2006/0030164 A1 * | 2/2006 | Im | ........................ | 438/795 |

* cited by examiner

Primary Examiner—Robert Kunemund
Assistant Examiner—G. Nagesh Rao
(74) Attorney, Agent, or Firm—McKenna, Long & Aldridge LLP

(57) ABSTRACT

A method for crystallizing silicon is provided. The method includes: forming an amorphous silicon layer on a substrate; aligning a mask above the substrate, the mask being divided into a plurality of blocks, each block having at least two transmission patterns, the transmission patterns of one block and the transmission patterns of another adjacent block being complimentary with each other and the mask including at least two diffraction patterns disposed between the transmission patterns; forming a first crystallization region on the amorphous silicon layer by irradiating a laser beam through the transmission patterns of the mask; and displacing the substrate or the mask by a predetermined distance and irradiating a laser beam onto the substrate to recrystallize the crystallization region using the laser beam that passes through the diffraction patterns, and forming a second crystallization region using the laser beam that passes through the transmission patterns.

10 Claims, 13 Drawing Sheets

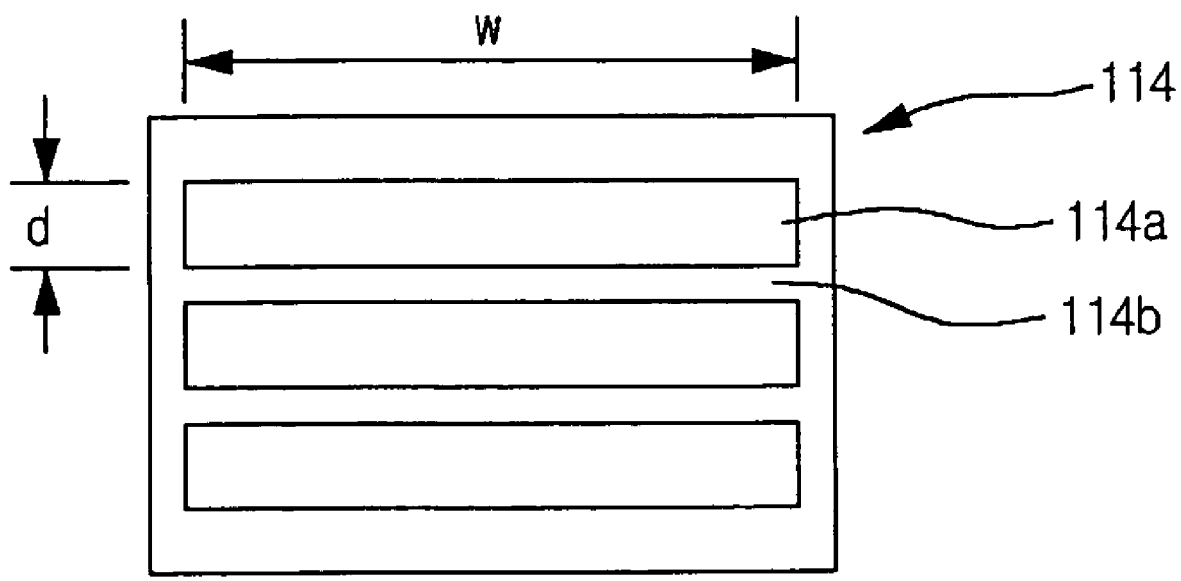

METHOD FOR CRYSTALLIZING SILICON

This application claims the benefit of Korean Patent Application No. 2003-37740, filed on Jun. 12, 2003, which is hereby incorporated by reference for all purposes as if fully set forth herein.

BACKGROUND OF THE INVENTION

1. Field of the Invention

The present invention relates to a method for crystallizing silicon, and more particularly, to a method for crystallizing silicon using a sequential lateral solidification (SLS) process.

2. Discussion of the Related Art

As modem society has quickly changed into an information-oriented society, flat panel displays are widely used because they have many advantages such as a slim profile, lightweight, low power consumption and the like. Among the flat panel displays, liquid crystal displays (LCD) having superior color reproduction have been developed.

Generally, the LCD includes two substrates facing each other. Electrodes are formed on facing surfaces of the substrates, and a liquid crystal material is injected into a space between the substrates. Therefore, the LCD displays an image by applying a voltage to electrodes to vary the twist of liquid crystal molecules to vary the light transmissibility through the liquid crystal.

A lower substrate of the LCD includes thin film transistors (TFT) and an active layer that is typically formed of amorphous silicon (a-Si:H).

As amorphous silicon can be deposited in a thin film at a relatively low temperature, it is widely used for forming TFTs in a liquid crystal panel with a substrate formed of a glass having a relatively low-melting point.

However, the amorphous silicon thin film has a problem in that it deteriorates the electric characteristics and reliability of the TFTs in the liquid crystal panel, and make it difficult to produce LCDs with large screen sizes.

For a large-sized, high-definition panel image driver circuit, a laptop computer, and a wall-mountable LCD TV, a pixel-driving device having improved electrical characteristics (i.e., a high electric field effect mobility (30 cm$^2$/VS), a high frequency performance characteristic, and a low leakage current) is required. A high quality polycrystalline silicon improves the electrical characteristics of the TFTs.

The electrical characteristics of the polycrystalline silicon thin film particularly depend on the size of the grain, that is, the greater the size of the grain, the greater the electric field effect mobility.

Accordingly, methods for single-crystallizing silicon has become a major issue in the art. PCT Publication No. WO 97/45827 and Korean Unexamined Patent No. 2001-004129 disclose a sequential lateral solidification (SLS) technique for making a massive single crystalline silicon structure by inducing lateral growth of a silicon crystal using a laser as an energy source.

The SLS technique relies upon the fact that a silicon grain grows in a direction normal to a boundary surface between liquid silicon and solid silicon as heated silicon cools. Such an SLS technique crystallizes an amorphous silicon thin film by letting the silicon grain laterally grow to a predetermined length, by appropriately adjusting laser energy intensity and a range between the laser and the silicon.

A method for crystallizing the silicon using the SLS technique will now be described in conjunction with the accompanying drawings.

FIG. 1 shows an SLS apparatus used for a conventional SLS crystallizing method.

An SLS apparatus 100 includes a laser generator 111 for generating a laser beam 112, a convergence lens 113 for converging the laser beam 112 irradiated from the laser generator 111, a mask 114 for dividing the laser beam into a plurality of sections and projecting the divided sections onto a substrate 116, and a scale lens 115 for reducing the laser beam 112 passing through the mask 114 by a predetermined factor.

The laser generator 111 irradiates a laser beam 112, and the irradiated laser beam 112 is adjusted in its intensity while passing through an attenuator (not shown) and then passes through the mask 114 and through the convergence lens 113. Amorphous silicon is deposited on the substrate 116, which is disposed on an X-Y stage 117.

To crystallize the entire area of the substrate 116, a method for gradually enlarging the crystallized area by minutely moving the X-Y stage 117 is used.

The mask 114 is divided into laser beam transmission regions 114a allowing for the transmission of the laser beam 112, and laser beam shielding regions 114b for absorbing the laser beam 112.

The distance between the transmission regions 114a (the width of each shielding region 114) determines the length of a laterally grown grain.

A method for crystallizing the silicon using the above-described SLS apparatus will now be described.

Generally, crystalline silicon is used for forming a buffer (insulating) layer (not shown) on the substrate 116, and amorphous silicon is deposited on the buffer layer.

The amorphous silicon layer is deposited on the substrate 116 using, for example, a chemical vapor deposition (CVD) process, in the course of which a large amount of hydrogen can be retained in the amorphous silicon layer.

Because the hydrogen tends to separate from the thin film by heat, the amorphous silicon layer may undergo dehydrogenization through heat treatment.

When the hydrogen is not removed in advance, the crystallized layer may be exfoliated due to the rapid volume expansion of the hydrogen gas retained in the amorphous silicon layer during the crystallization process.

In addition, the crystallization process using the laser cannot simultaneously crystallize the entire area of the surface. Because the width of the laser beam 112 and the size of the mask 114 are limited, to crystallize the large-sized screen panel, a single mask 114 is moved many times and the crystallization process is repeated after the mask 114 is moved.

A unit block is an area that is crystallized that is as large as the area of the single mask 114, and the crystallization of the unit block may be realized by repeatedly irradiating the laser beam.

FIG. 2 is a graph illustrating the crystallization of silicon with respect to laser energy density, in which laser crystallization regions are classified according to grain size.

As shown in FIG. 2, a first range is the partial melting range. In the partial melting range, only the surface of amorphous silicon layer is molten to form small grains.

A second range is a near complete melting range. In the near complete melting range, grains having a size larger than the size of the grains of the first range can be formed, but it is difficult to form grains having a uniform size.

A third range is a complete melting range. In the complete melting range, the whole amorphous silicon layer is molten and then fine grains are formed due to homogeneous nucleation.

In the conventional method for crystallizing silicon using the SLS technique, the crystallization is performed using a laser energy density in the complete melting range (i.e., third range).

FIG. 3 shows a schematic plan view illustrating a mask used for crystallizing silicon using the conventional SLS technique.

As shown in the drawing, a mask 114 includes transmission and shielding regions 114a and 114b. Each of the transmission regions 114a is made in the form of a long slit extending in a first direction.

A width d of the transmission region 114a is designed to be less than twice as long as a maximum length of a grain grown by a primary laser irradiation process.

When the laser beam is irradiated through the mask structure onto the silicon, the grains grow laterally in molten regions of the amorphous silicon layer, which correspond to the transmission regions of the mask. The grains laterally grow from both boundaries of the molten region until they contact each other at a middle portion of the molten region.

During the crystallization process, the beam pattern passing through the mask 114 and reduced by the scale lens 115 (see FIG. 1) moves in a direction of an X-axis.

The crystallization process proceeds while the laser pattern moves in steps of approximately 200 μm to 100 mm over the length of the mask (i.e., the length of a pattern as reduced by the scale lens 115).

The crystallization method using the conventional SLS technique will now be described in more detail with reference to FIGS. 4A through 4C, which illustrate an example of a 2-shot SLS poly silicon crystallization method. In this example, it is assumed that three transmission patterns (regions) are defined on the mask.

In the 2-shot poly crystalline silicon crystallization method, regions of the amorphous silicon layer that correspond to the transmission regions are crystallized by irradiating the laser beam twice. In addition, this crystallization process is repeatedly carried out in a lengthwise direction. When the crystallization is completed in the lengthwise direction of the substrate, the laser pattern minutely moves in a direction substantially perpendicular to the lengthwise direction and then moves lengthwise to proceed with the crystallization thereby completing the crystallization process for the desired region.

In more detail, the mask 114 (see FIG. 3) is initially located at a starting point on the substrate, and the first laser beam is irradiated to begin the crystallization process for the amorphous silicon layer deposited on the transparent insulating substrate.

The irradiated laser beam is divided into a plurality of sections while passing through the plurality of slits 114a (see FIG. 3) formed on the mask 114. Regions of the amorphous silicon layer, corresponding to the slits 114a are liquefied by the divided laser beams.

In this case, laser energy intensity is set to be in the complete melting range in which the amorphous silicon layer becomes completely molten.

When the laser beam irradiation is completed, silicon grains grow laterally at a boundary between the solid amorphous silicon region and the liquefied amorphous silicon region.

The width of the beam pattern on the substrate is set to be less than twice as long as a length of the grown grain. In addition, the crystallized regions correspond to the transmission regions 114a (see FIG. 2) of the mask. Therefore, each of the crystallized regions A1, A2, and A3 has a length corresponding to that of each of the transmission regions 114a. Regions of the amorphous silicon layer, which correspond to the shielding regions 114b (see FIG. 2) of the mask, remain amorphous silicon regions 167.

In the crystallized regions A1, A2, and A3, the grains 166a and 166b grow laterally from the boundaries between the liquefied silicon and the solid silicon, thereby defining a grain boundary as shown in FIGS. 4A to 4C.

Afterwards, the crystallization process is repeatedly carried out in a direction of the X-axis while the stage carrying the substrate moves by approximately 200 μm to 100 mm over the length of the mask.

As shown in FIG. 4B, when the first crystallization in the direction of the X-axis is completed, the mask 114 or the X-Y stage 117 (see FIG. 2) is minutely moved in a direction of a Y-axis.

Next, a second laser irradiation is initiated from a point where the first crystallization is finished in the direction of the X-axis. Through the second laser irradiation, the grains of the crystallized silicon formed by the first laser irradiation are further consecutively grown. The grains are further grown to have a length that is half as long as a distance "k" from the grain boundary 116c of the crystallized region A1 to the grain boundary of the adjacent crystallized region A2.

Accordingly, as shown in FIG. 4C, a polycrystalline silicon thin film formed of the grains 168a and 168b having a predetermined length can be realized.

At this point, in newly crystallized regions B1 and B2, grains 168a and 168b are vertically grown from the boundaries between the liquefied silicon and the solid silicon. The grains 168a and 168b are further grown until they contact each other, thereby defined a new grain boundary 168c. A part of the crystal formed thus is shown in a partially enlarged view of FIG. 4C.

The related art method for crystallizing amorphous silicon using the aforementioned SLS technique is carried out in the complete melting range where the amorphous silicon is completely melted. The lateral crystallization in the complete melting range may include many inner defects 169 inside large grains. The inner defects 169 are cured by performing a secondary excimer laser annealing (ELA) in the near complete melting range having an energy density less than an energy density of the complete melting range.

However, the related art method using the high energy laser beam twice and the low energy laser beam once increases the overall process time of the crystallization, so that the process yield decreases.

SUMMARY OF THE INVENTION

Accordingly, the present invention is directed to a method for crystallizing silicon that substantially obviate one or more problems due to limitations and disadvantages of the related art.

It is an advantage of the present invention to provide a method for crystallizing silicon that can grow grains with a good quality using an SLS technique.

To achieve these advantages and in accordance with the purpose of the invention, as embodied and broadly described herein, there is provided a method for crystallizing silicon, the method comprising: forming an amorphous silicon layer on a substrate; aligning a mask above the substrate, the mask being divided into a plurality of blocks, each block having at least two transmission patterns, the transmission patterns of one block and the transmission patterns of another adjacent block being complimentary with each other and the mask including at least two diffraction patterns disposed between the transmission patterns; forming a first crystallization region on the amorphous silicon layer by irradiating a laser beam through the transmission patterns of the mask; and displacing the substrate or the mask by a predetermined distance and irradiating a laser beam onto the substrate to recrystallize the crystallization region using the laser beam that passes through the diffraction patterns, and forming a second crystallization region using the laser beam that passes through the transmission patterns.

The mask includes a plurality of blocks, each block having at least two transmission patterns, the transmission patterns of one block and the transmission patterns of another adjacent block being complimentary with each other, and at least two diffraction patterns disposed between the transmission patterns.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a schematic plan view of a mask for crystallizing silicon using a conventional SLS technique;

DETAILED DESCRIPTION OF THE ILLUSTRATED EMBODIMENTS

Reference will now be made in detail to embodiments of the present invention, examples of which are illustrated in the accompanying drawings.

In the present invention, a single scan technology is used for crystallizing an amorphous silicon layer of a desired region. In the single scan technology, a mask is divided into N blocks, each of the blocks having transmission patterns and shielding patterns. The transmission patterns and the shielding patterns of different blocks are designed to have different configurations. The different blocks are all scanned by irradiating a laser beam once as the mask moves in a lengthwise direction of the mask.

Figure 1:
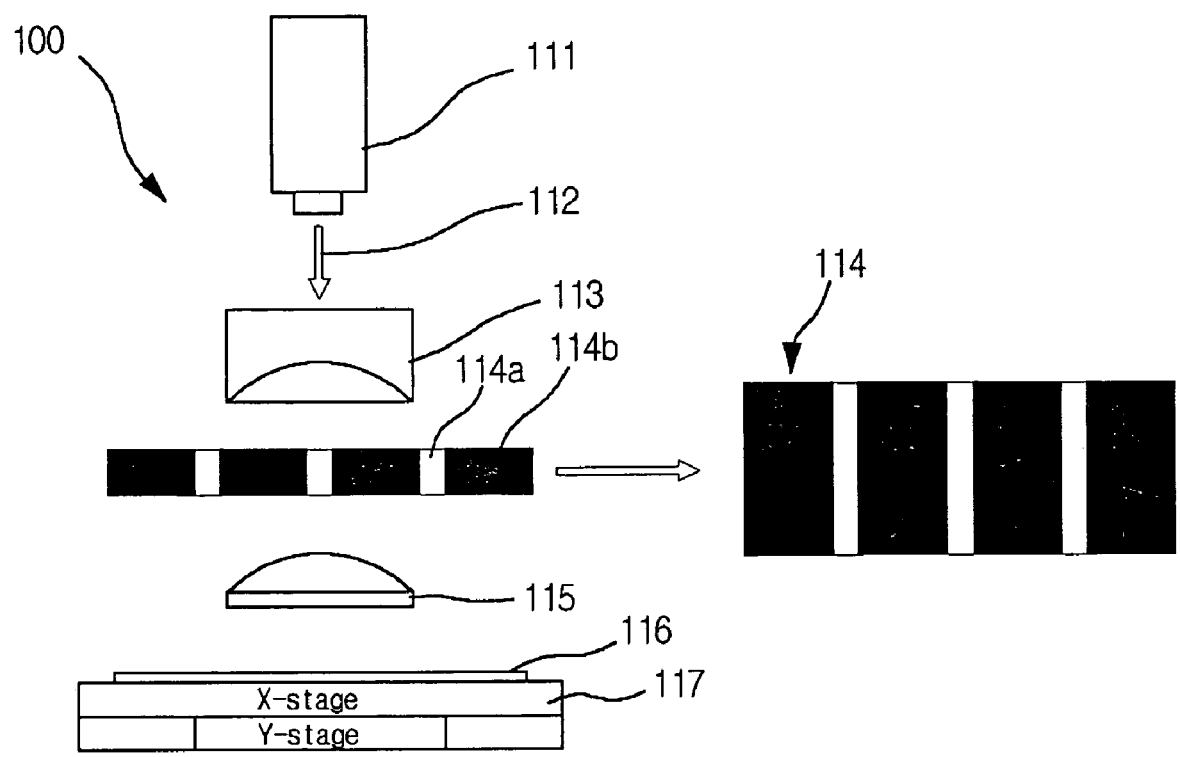
FIG. 1 is a schematic view of an apparatus used in a conventional SLS crystallizing method.
Figure 2:
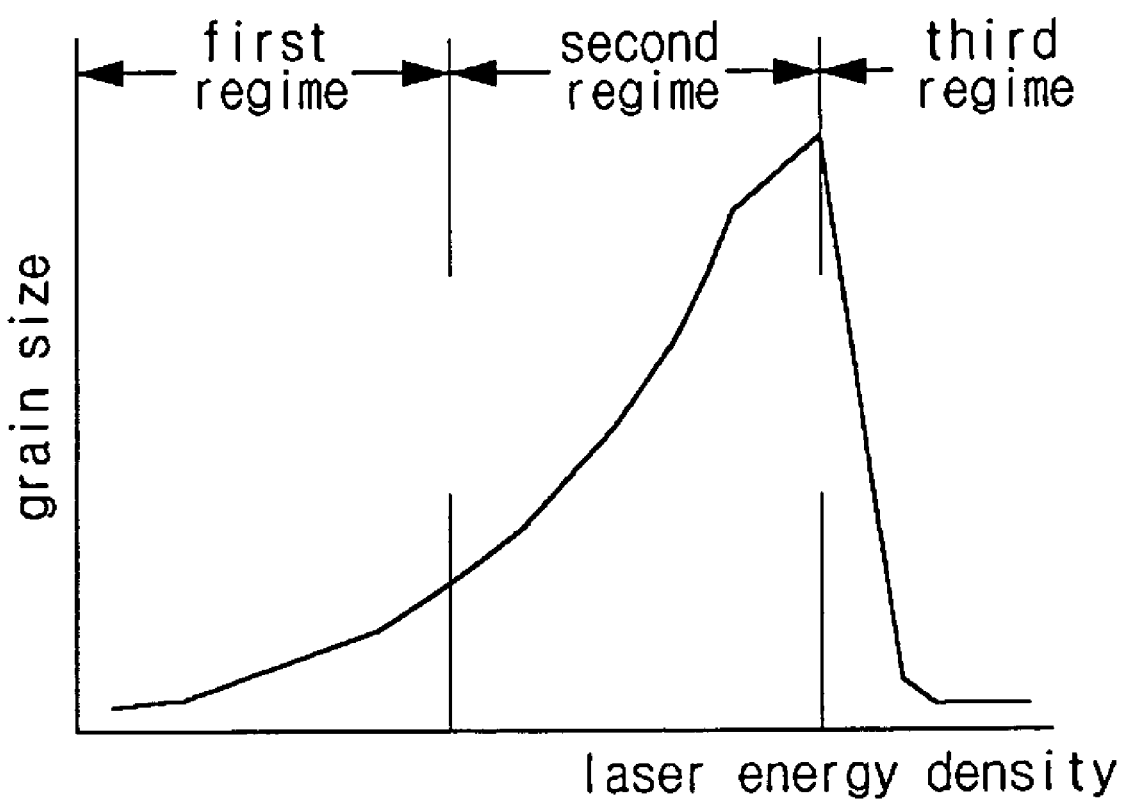
FIG. 2 is a graph illustrating crystallization of silicon with respect to a laser energy density, in which laser crystallization ranges are classified according to a grain size.
Figure 4A:
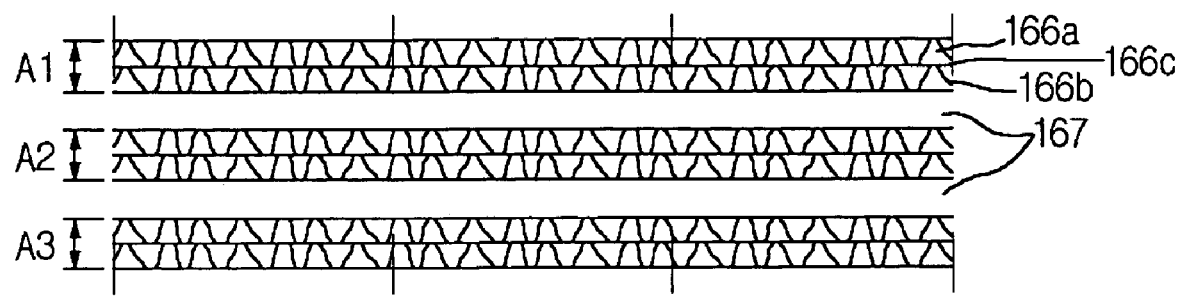
FIGS. 4A through 4C are views illustrating a method for crystallizing silicon using a conventional SLS process.
Figure 4B:
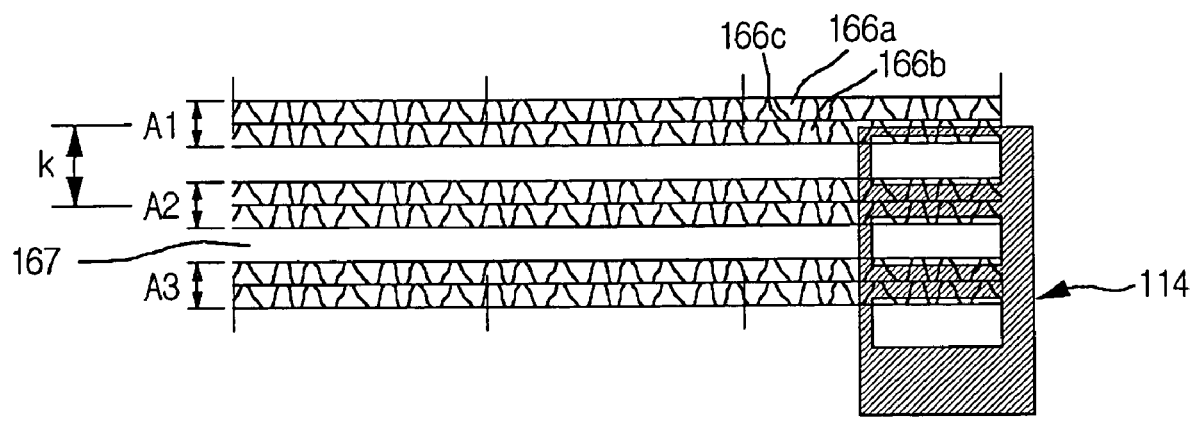
Figure 4C:
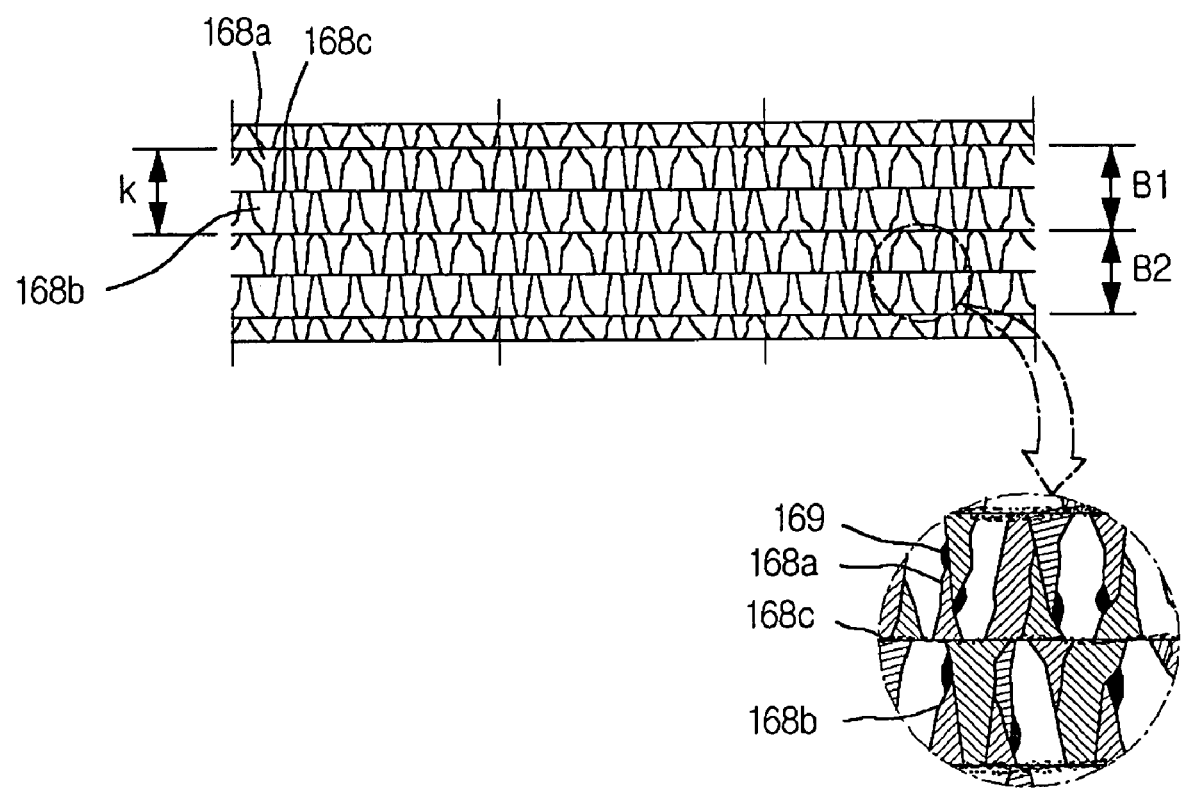
Figure 5:
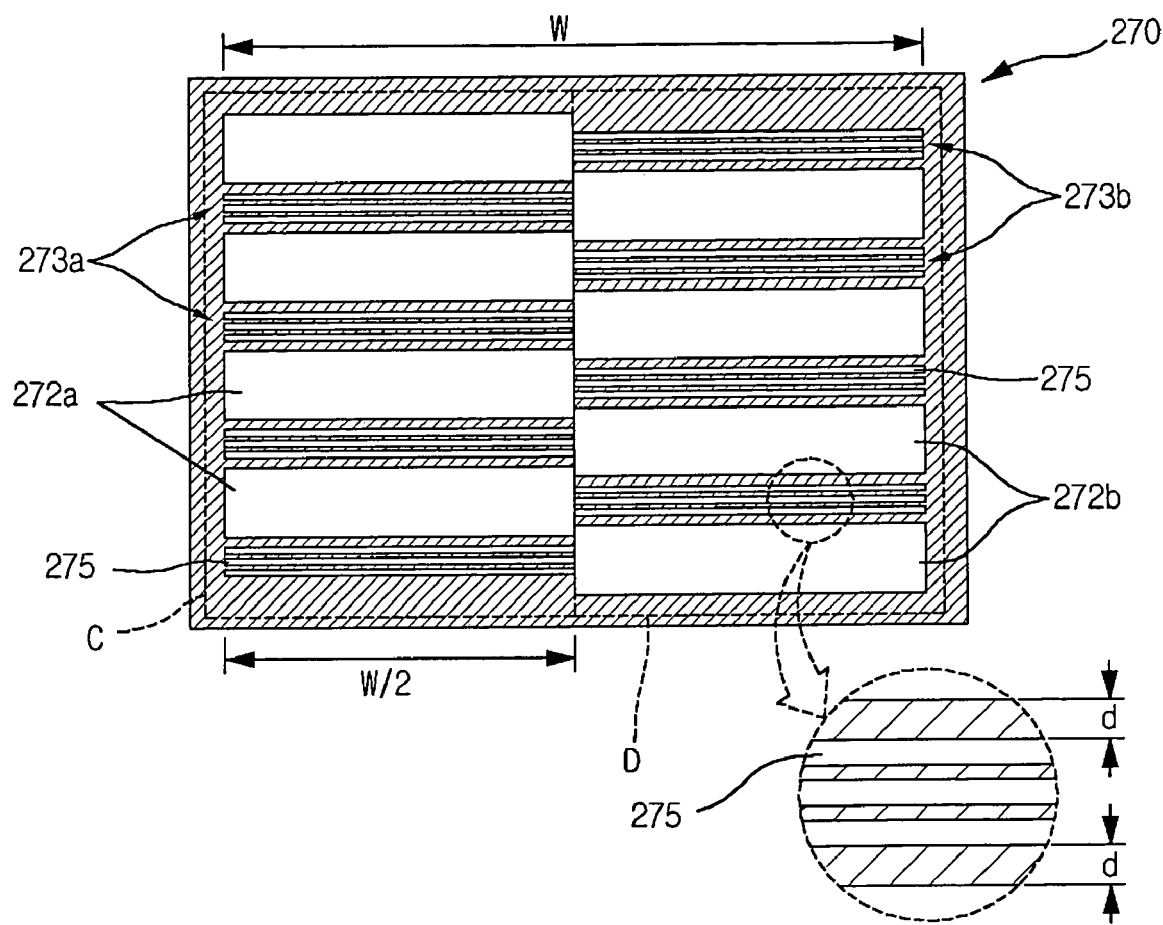
FIG. 5 is a schematic plan view illustrating a mask used in a method for crystallizing silicon using an SLS technique according to an embodiment of the present invention.

FIG. 5 is a schematic plan view illustrating a mask with two blocks used in a method for crystallizing silicon using an SLS technique according to an embodiment of the present invention.

Referring to FIG. 5, the mask 270 includes a first block C and a second block D. The first block C has a plurality of transmission patterns 272a spaced apart by a predetermined distance from one another in a vertical direction, and a plurality of shielding regions 273a. The second block D has a plurality of shielding regions 273b, and a plurality of transmission patterns 272b, which are designed to correspond to regions between the transmission patterns 272a of the first block C.

Accordingly, by displacing the mask 270 in a lateral direction by half (W/2) of width W of blocks C and D, the transmission patterns 272a of the first block C are aligned above the amorphous silicon at positions corresponding to shielding regions 272c between the transmission patterns 272b of the second block D.

The transmission patterns have a width, which is less than or equal to double the maximum crystal growth length possible by once irradiating the laser beam.

Each of the shielding regions 273a and 273b of the mask 270 has a plurality of narrow slits 275. The slits 275 diffract the laser beam when the laser beam passes through the slits 275.

Thus, the shielding regions 273a and 273b of the mask 270 do not completely shield the laser beam but partially pass the laser beam through the slits 275. The laser beam that passes through the slits 275 and that irradiates the amorphous silicon does so with a reduced energy density. By performing the crystallization while moving the stage on which the mask is loaded in a lateral direction, crystallization of a desired region may be completed by one irradiation of the laser beam.

The slits 275 of the shielding regions 273a and 273b are centered on a middle portion of the desired region. As shown in a detailed view of FIG. 5, the slits of the shielding regions 273a and 273b are arranged spaced apart by a distance D from edges of the shielding regions 273b, thereby providing a seed for a lateral crystallization.

When a laser beam with a high energy density in the complete melting range is irradiated, the laser beam that passes through the transmission patterns 272a and 272b of the mask 270 supplies a high energy to the amorphous silicon layer, thereby laterally crystallizing the amorphous silicon layer. The laser beam that passes through the slits 275 of the shielding regions 273a and 273b is diffracted and supplies a uniform and low energy density (near complete melting range or partial melting range) to the amorphous silicon layer, thereby performing recrystallization.

After the primary laser beam is irradiated onto the mask 270, the shielding regions 273b of the second block D are disposed at positions corresponding to the transmission patterns 272a of the first block C by displacing a stage (not shown) beneath a substrate in a lateral direction by a distance W/2. Next, by irradiating the secondary laser beam onto the mask 270, grain regions formed by irradiating the primary laser beam are again activated.

A method for crystallizing silicon according to an embodiment of the present invention will now be described with reference to sectional views of FIGS. 6A to 6E.

Figure 6A:
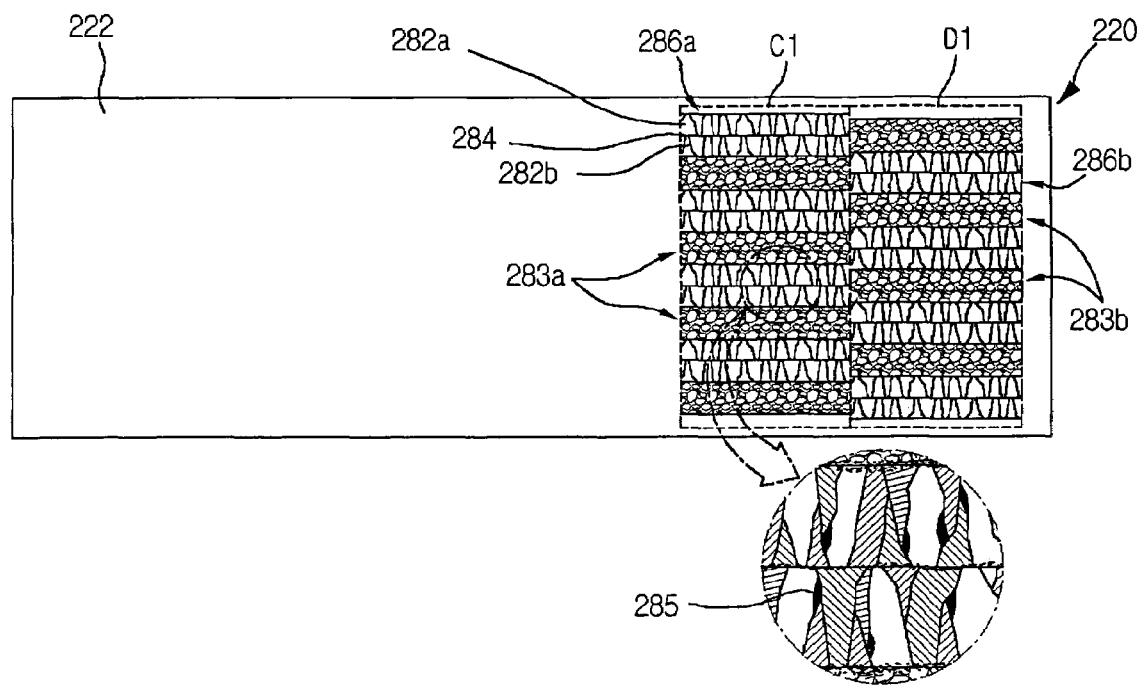
FIGS. 6A through 6E are sectional views illustrating sequential processes of a method for crystallizing silicon according to another embodiment of the present invention.

First, a buffer layer (not shown) that is an insulating layer is first formed on a substrate 220, and an amorphous silicon layer 222 is deposited on the buffer layer. Next, the amorphous silicon layer 222 is first heat-treated to remove hydrogen. Afterwards, as shown in FIG. 6a, the mask 270 illustrated in FIG. 5 is disposed above the substrate 220 on which the amorphous silicon layer 222 is deposited. The mask is not shown in FIG. 6A. Then, as a primary laser beam is irradiated onto the mask 270, a laser beam pattern formed by the transmission patterns 272a and 272b of the mask 270 is irradiated onto the amorphous silicon layer 222.

Regions where the primary laser beam is irradiated through the transmission patterns 272a and 272b of the mask 270 become complete melting ranges. Thereafter, the temperature of the complete melting ranges is lowered and grains grow from both grain boundaries of the complete melting ranges, thereby forming a first grain region 282a and a second grain region 282b and forming a grain boundary 284 at a boundary where the first grain region 282a and the second grain region 282b meet.

The amorphous silicon, which is completely melted by the primary laser beam, begins crystal growth using the solid amorphous silicon on both sides of the melted silicon as seeds. As shown in FIG. 6A, the grains 282a and 282b grow from upper and lower sides, respectively, and the grain boundary 284 is formed at a region where the first grain 282a meets with the second grain 282b.

Regions where the primary laser beam is irradiated through the shielding regions 273a and 273b of the mask 270 are partially melted, and crystals are formed at the partially melted regions.

The shielding regions 273a and 273b have the slits 275, and the laser beam that passes through the slits 275 is diffracted, so that a relatively low energy is supplied to the silicon.

The crystallized regions shown in FIG. 6A correspond to regions of the mask 270 of FIG. 5. The crystallized regions include a first crystallization region group C1 corresponding to the first block C of the mask 270 and a second crystallization region group D1 corresponding to the second block D of the mask 270. The first crystallization region group C1 includes a plurality of first crystallization regions 286a and a plurality of first active regions 283a, and the second crystallization region group D1 includes a plurality of second crystallization regions 286b and a plurality of second active regions 283b.

The laser beam with a high and uniform energy is irradiated onto the first crystallization regions 286a and the second crystallization regions 286b with at an equal area and an equal shape. Unlike in the first crystallization regions 286a and the second crystallization regions 286b, the laser beam with a low and uniform energy is irradiated onto the first active regions 283a and the second active region 283b at an equal area and an equal shape, thereby performing the crystallization.

As shown in a partially enlarged view of FIG. 6A, large grains, which laterally grow in the complete range, are formed at the crystallization regions 286a and 286b, and many defects 285 are also formed together with the grains.

Figure 6B:
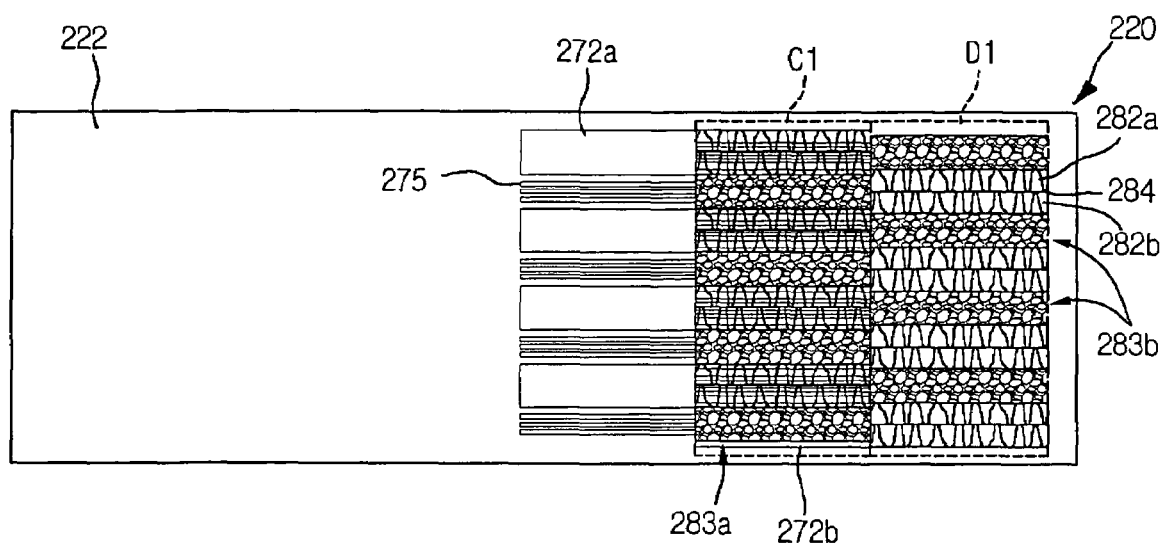

Next, as shown in FIG. 6B, after the amorphous layer is crystallized by the primary laser beam irradiation, the stage (not shown) is moved a distance W/2 in a lengthwise direction. As the stage is moved in the lengthwise direction and the transmission patterns 272a and 272b are also moved, the transmission patterns 272a of the second block D of the mask and the shielding regions 273a are positioned above the first crystallization region group C1, which is crystallized by irradiating the primary laser beam. At this time, the transmission patterns 272b of the second block D are positioned above the first active regions 283a, which are partially activated, and the shielding regions 273b including the slits 275 are positioned above the first crystallization regions 286a, which are laterally crystallized.

Next, as a secondary laser beam is irradiated onto the mask 270, the amorphous silicon corresponding to the transmission patterns 272a of the first block C of the mask 270 is completely melted and crystallized, and the amorphous silicon corresponding to the shielding regions 273a including the slits 275 is partially melted and crystallized.

The first active regions 283a corresponding to the transmission patterns 272b of the second block D of the mask 270 disposed above the second crystallization region group. D1 are completely melted and crystallized. Also, the first crystallization regions corresponding to the shielding regions including the slits 275 are recrystallized (activated) by the laser beam with a low energy, thereby removing the inner defects 285.

Figure 6C:
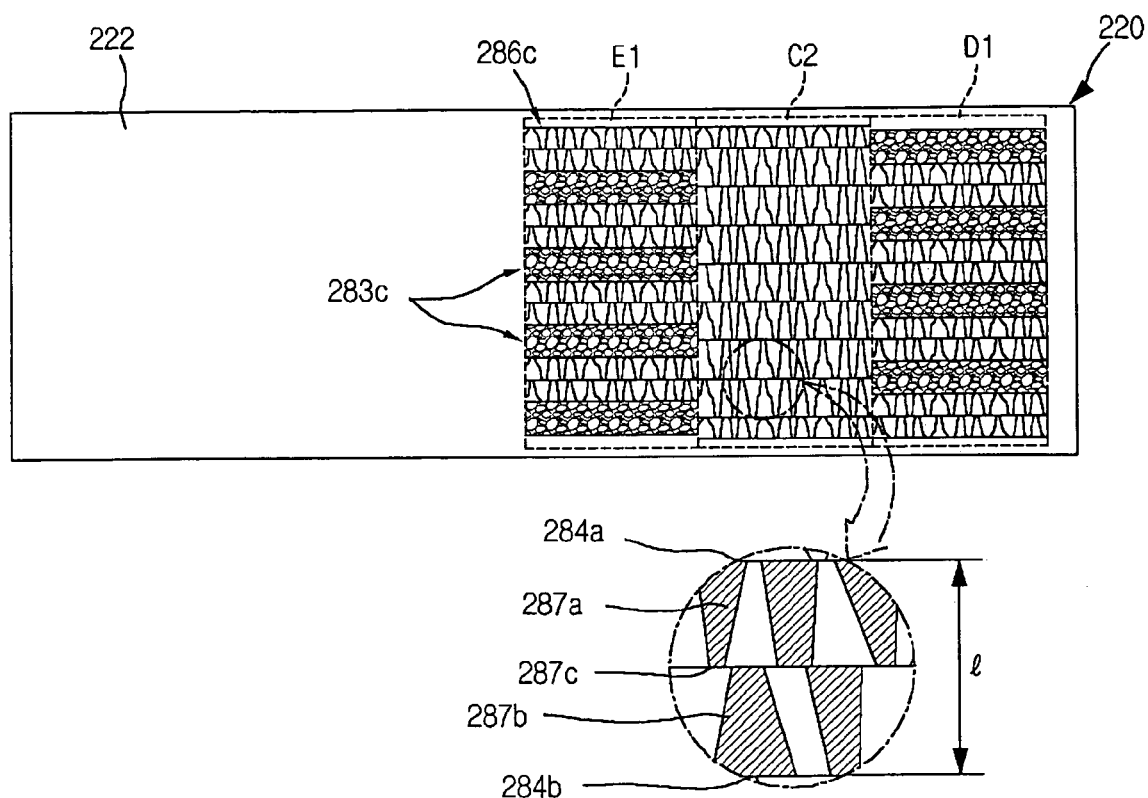

Accordingly, as shown in FIG. 6C, the first crystallization region group C1 formed by irradiating the primary laser beam and the regions overlapping with the second block D of the mask when the secondary laser beam is irradiated become a complete crystallization region C2. At the same time, a third crystallization region group E1 including a third crystallization region 286c and a third active region 283c is formed.

The size of the grains 287a and 287b formed in the crystallization region C2 is equal to half of a distance (l) between a grain boundary 284a formed by irradiating the primary laser beam and an adjacent grain boundary 284b formed by irradiating the secondary laser beam, and a new grain boundary 287c is formed at a middle portion.

As shown in a partially enlarged view of FIG. 6C, when a laser beam having a low energy level is irradiated onto the first crystallization regions by irradiating the secondary laser beam, the inside of the grain is activated and recrystallized, so that inner defects are cured.

Figure 6D:
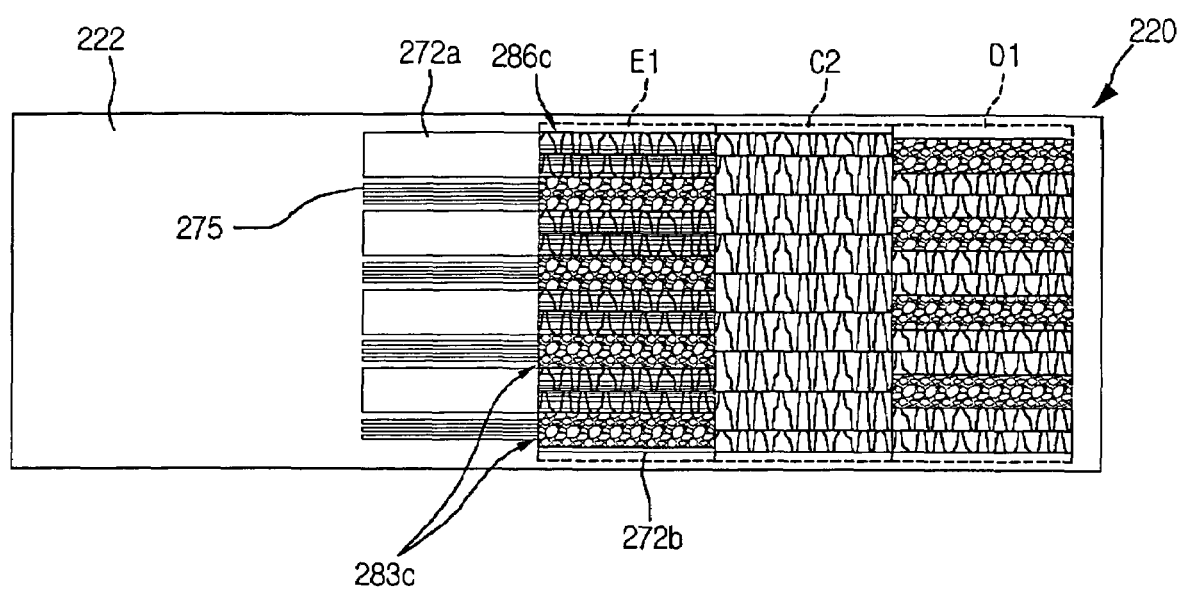

Next, as shown in FIG. 6D, if the stage is further moved in the lateral direction, the transmission patterns 272b of the second block D of the mask 270 and the shielding regions 283b including the slits 275 are positioned above the third crystallization region group E1 newly crystallized by irradiating the primary laser beam and the secondary laser beam. At this time, the transmission patterns 272b of the second block D are positioned above the third active regions 283c partially activated, and the shielding regions 273b including the slits 275 are positioned above the third crystallization region group E1 laterally crystallized.

Figure 6E:
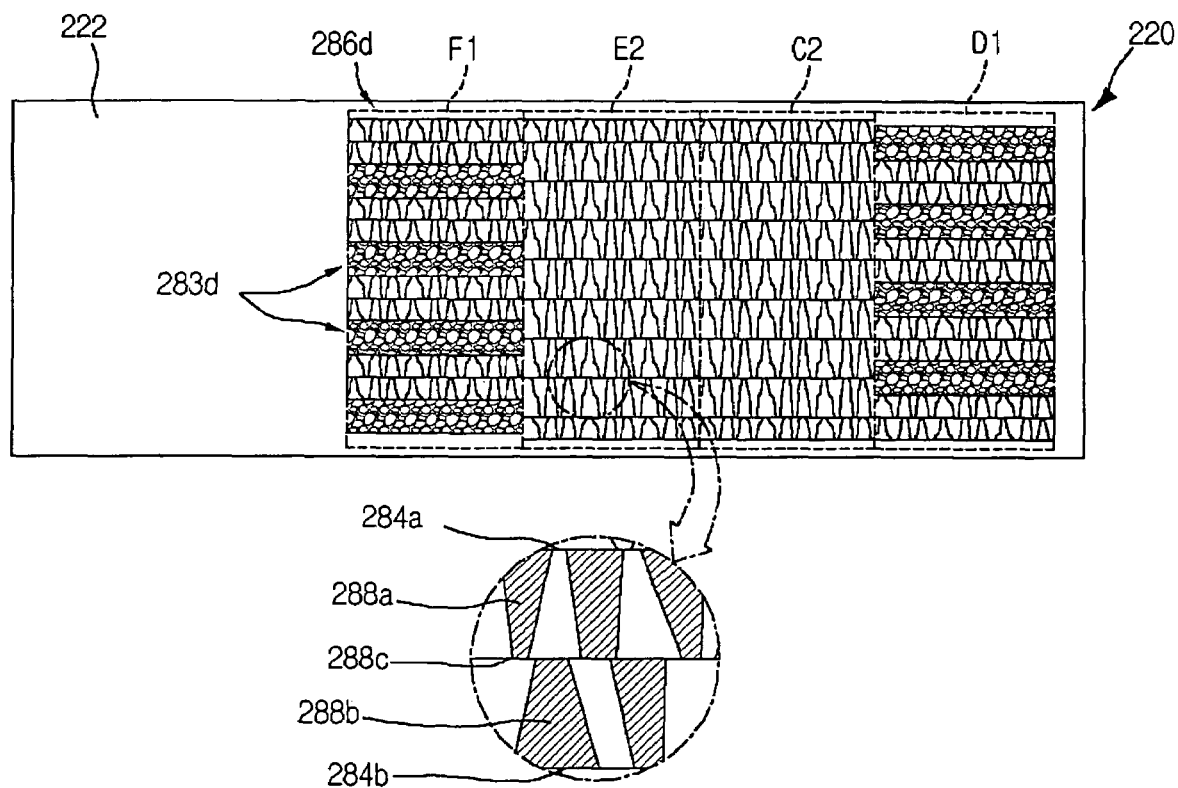

After the mask is again arranged as above, another laser beam irradiates the mask 270 and a new section of the amorphous silicon corresponding to the transmission patterns 272a of the first block C of the mask 270 causing it to melt, and crystallization regions 286d are formed as shown in FIG. 6E. The amorphous silicon corresponding to the shielding regions 273a including the slits 275 is partially molten to form active regions 283a, thereby forming a new crystallization region group F1.

Also, the third active regions 283c corresponding to the transmission patterns 272b of the second block D of the mask 270 disposed above the third crystallization region group E1 are completely melted and crystallized. Also, the third crystallization regions 286c corresponding to the shielding regions 273b including the slits 275 are recrystallized (activated) by the laser beam with a low energy to cure inner defects of the grain, thereby forming a complete crystallization region E2.

By repeating the operations depicted in FIGS. 6A through 6E, a polycrystalline silicon layer defined by a plurality of grain regions may be obtained.

In the above embodiments for the crystallizing the silicon layer, the stage beneath the substrate is displaced. However, the invention is not limited to such a displacement, and it is possible to perform the crystallization while moving the mask or moving the mask together with the stage.

Figure 7:
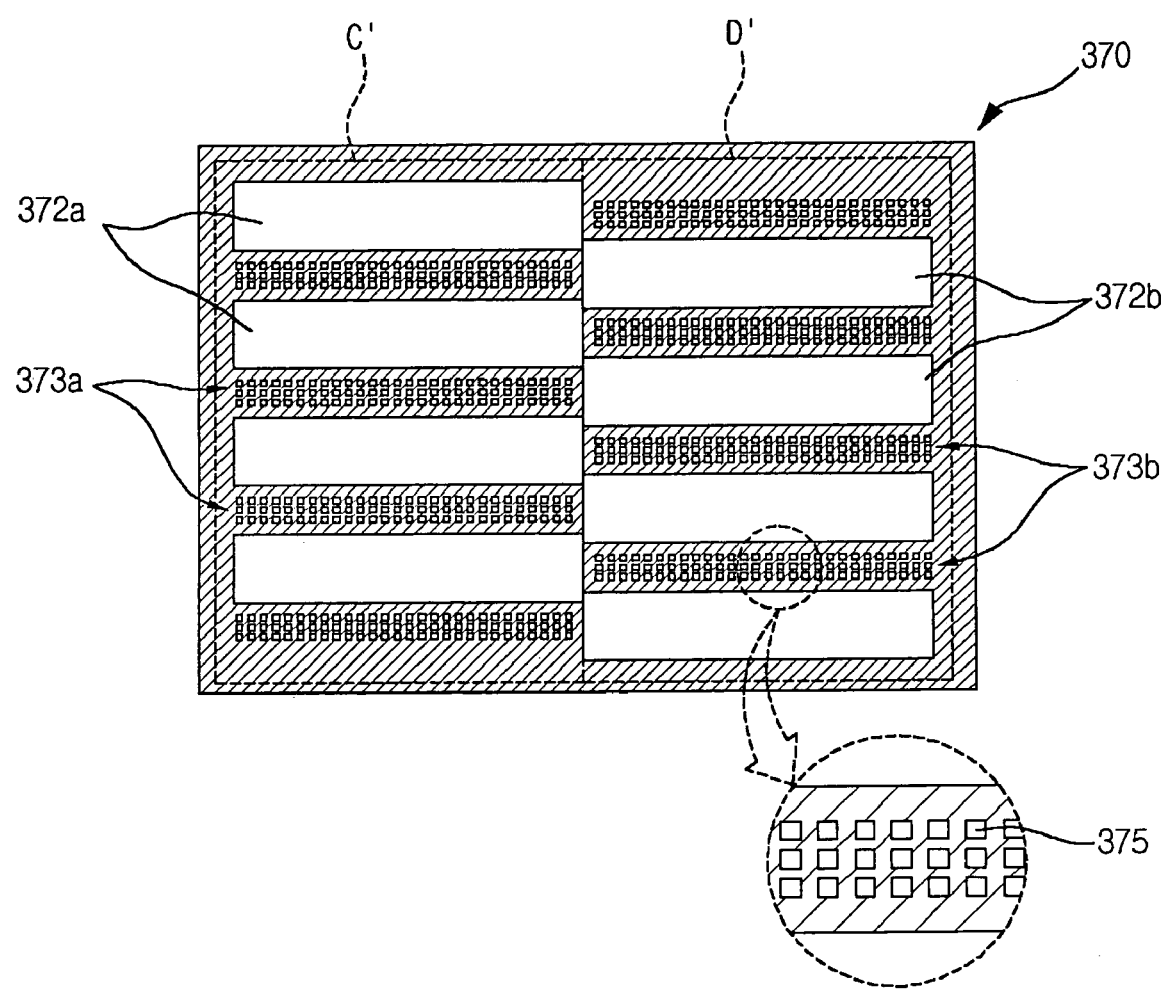
FIG. 7 is a schematic plan view of a mask used in a method for crystallizing silicon using an SLS technique according to another embodiment of the present invention.

FIG. 7 is a schematic plan view of a mask used in a method for crystallizing silicon using an SLS technique according to another embodiment of the present invention.

Referring to FIG. 7, the mask 370 includes a first block C' and a second block D'. The first block C' has a plurality of transmission patterns 372a spaced apart by a predetermined distance from one another in a vertical direction, and a plurality of shielding regions 373a. The second block D' has a plurality of shielding regions 373b, and a plurality of transmission patterns 372b, which correspond to regions between the transmission patterns 372a of the first block C'.

A plurality of rectangular transmission holes 375 are formed in the shielding regions 373a and 373b, respectively. Accordingly, a laser beam that passes through the transmission holes 375 is diffracted, thereby having a low energy density. In the above embodiment, although the rectangular transmission holes 375 are exemplarily shown, the transmission holes may be formed in various shapes such as a circular shape, a triangle shape, etc.

As described above, according to the present invention, polycrystalline silicon layer is formed using the SLS technique. A mask used in the inventive method is divided into N blocks, each block having transmission patterns through which a laser beam passes completely, and shielding patterns having a plurality of slits for partially diffracting the laser beam and lowering the energy density of the diffracted laser beam. By constructing the mask as above and because a laser beam having a high energy level and a laser beam having a low energy level can be obtained at the same time by one laser operation, defects of a crystallized layer generated by the laser beam having the high energy level can be activated and cured by the laser beam having the low energy level. As a result, a high quality polycrystalline silicon can be formed without lowering of the process yield.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for crystallizing silicon, the method comprising:

forming an amorphous silicon layer on a substrate;

aligning a mask above the substrate, the mask being divided into a plurality of blocks, each block having at least two transmission patterns, the transmission patterns of one block and the transmission patterns of another adjacent block being complimentary with each other and the mask including at least two diffraction patterns disposed between the transmission patterns;

forming a first crystallization region on the amorphous silicon layer by irradiating a laser beam through the transmission patterns of the mask; and displacing the substrate or the mask by a predetermined distance and irradiating a laser beam onto the substrate to recrystallize the crystallization region using the laser beam that passes through the diffraction patterns, and forming a second crystallization region using the laser beam that passes through the transmission patterns, wherein the diffraction patterns include one of at least two slits and at least two or more transmission holes.

2. The method according to claim 1, wherein in the displacing the substrate or the mask, one displacement corresponds to half a size of the mask.

3. The method according to claim 1, wherein the transmission patterns of the mask has a width that is less than or equal to twice a maximum growth length of a grain that can grow with a single laser beam irradiation.

4. The method according to claim 1, wherein at least two transmission holes have a shape selected from one of a rectangle, a circle and a triangle.

5. The method according to claim 1, wherein at least two diffraction patterns are spaced apart by a predetermined interval from at least two transmission patterns adjacent to at least two diffraction patterns.

6. The method according to claim 1, wherein the laser beam that passes through the two or more transmission patterns of the mask has an energy density that is greater than an energy density of the laser beam that passes through at least two diffraction patterns.

7. The method according to claim 1, wherein at least two transmission patterns are formed in a stripe pattern.

8. The method according to claim 1, wherein at least two transmission patterns have a width that is greater than a width of at least two diffraction patterns.

9. The method according to claim 1, wherein the laser beam is irradiated onto the mask with an equal energy.

10. The method according to claim 1, wherein at least two diffraction patterns of the mask diffract the laser beam when the laser beam passes through at least two diffraction patterns.

* * * * *